United States Patent
Izumi (10) Patent No.: US 7,017,281 B2
(45) Date of Patent: Mar. 28, 2006

(54) SUBSTRATE PROCESSING APPARATUS AND SUBSTRATE PROCESSING METHOD DRYING SUBSTRATE BY SPRAYING GAS

(75) Inventor: Akira Izumi, Kyoto (JP)

(73) Assignee: Dainippon Screen Mfg. Co., Ltd., (JP)

( * ) Notice: Subject to any disclaimer, the term of this patent is extended or adjusted under 35 U.S.C. 154(b) by 0 days.

(21) Appl. No.: 10/634,432

(22) Filed: Aug. 5, 2003

(65) Prior Publication Data

US 2004/0040177 A1    Mar. 4, 2004

(30) Foreign Application Priority Data

Aug. 30, 2002 (JP) ............................. 2002-254214

(51) Int. Cl.
*F26B 21/00*    (2006.01)
(52) U.S. Cl. ............................. 34/565; 34/570; 34/426; 134/153; 134/198; 134/902
(58) Field of Classification Search .................. 34/329, 34/418, 423, 426, 443, 60, 68, 487, 488, 34/492, 524, 565, 570; 134/6, 7, 95.2, 95.3, 134/153, 198, 902
See application file for complete search history.

(56) References Cited

U.S. PATENT DOCUMENTS 5,803,970 A * 9/1998 Tateyama et al. ............. 134/53
5,967,156 A * 10/1999 Rose et al. ..................... 134/7
6,821,349 B1 * 11/2004 Mertens et al. ................. 134/2

FOREIGN PATENT DOCUMENTS

| JP | 10-172951 | 6/1998 |
| JP | 11-111666 | 4/1999 |
| JP | 11-233481 | 8/1999 |

OTHER PUBLICATIONS

English translation of Abstract for Japanese Patent No. 11-111666.
English translation of Abstract for Japanese Patent No. 10-172951.

* cited by examiner

*Primary Examiner*—Jiping Lu
(74) *Attorney, Agent, or Firm*—Ostrolenk, Faber, Gerb & Soffen, LLP (57) ABSTRACT

A first gas nozzle and a second gas nozzle are fixedly provided in the vicinity of the forward end of a nozzle arm. The nozzle arm is rotated along a locus R while a substrate rinsed with deionized water is rotated, for discharging nitrogen gas from the first and second gas nozzles. Visible moisture is loosely expelled from the upper surface of the substrate by spraying the nitrogen gas from the first gas nozzle, and moisture slightly remaining on a fine pattern or the like can also be completely removed by spraying the nitrogen gas from the second gas nozzle to the same region of the substrate as that sprayed with the nitrogen gas by the first gas nozzle. Consequently, the surface of the substrate can be stably and reliably dried. Thus, a substrate processing apparatus capable of stably and reliably drying the surface of the substrate is provided.

2 Claims, 7 Drawing Sheets

SUBSTRATE PROCESSING APPARATUS AND SUBSTRATE PROCESSING METHOD DRYING SUBSTRATE BY SPRAYING GAS

BACKGROUND OF THE INVENTION

1. Field of the Invention

The present invention relates to a substrate processing apparatus, particularly a single-substrate type substrate processing apparatus, and a substrate processing method spraying gas to a semiconductor substrate, a glass substrate for a liquid crystal display, a glass substrate for a photomask, a substrate for an optical disk or the like (hereinafter simply referred to as "substrate") for drying the substrate.

2. Description of the Background Art

A single-substrate type substrate processing apparatus supplying a chemical solution such as hydrofluoric acid to a substrate while rotating the same for etching or cleaning the substrate generally performs rinse processing with deionized water after the chemical solution processing, followed by drying processing for removing the deionized water adhering to the substrate. In general, such a substrate processing apparatus dries the substrate by a technique of rotating the substrate thereby spinning off the same as proposed in Japanese Patent Application Laying-Open Gazette No. 11-233481 (1999), for example.

In order to dry a large substrate such as a substrate for a liquid crystal display, the so-called air knife may be employed for spraying stratified gas from a slitlike discharge port to the surface of the substrate, as proposed in Japanese Patent Application Laying-Open Gazette No. 11-111666 (1999), for example.

In a drying step subsequent to the rinse processing with deionized water, however, imperfect drying may result in the form of water marks, which are readily caused particularly when the substrate processing apparatus etches silicon (Si) or polysilicon forming the surface of the substrate with hydrofluoric acid due to partial exposure of a hydrophobic surface. Oxygen contained in the atmosphere may conceivably be dissolved into moisture adhering to the surface of the substrate and react with Si to result in residues, which in turn form such water marks due to drying.

In order to prevent formation of such water marks, IPA (isopropyl alcohol) may be sprayed to the surface of the substrate in the drying processing for replacing the moisture with IPA. According to this method, however, combustible IPA is handled in the form of a liquid or gas, and hence the apparatus must be brought into an explosion-proof structure in consideration of safety. In view of the process, the conditional range for replacing the residual moisture with IPA is so narrow that reproducibility for prevention of water marks is hard to attain. When the organic IPA is supplied to the surface of the substrate in the final drying step, increasingly refined device characteristics may disadvantageously be deteriorated.

SUMMARY OF THE INVENTION

The present invention is directed to a substrate processing apparatus spraying gas to a substrate completely cleaned with deionized water for drying the substrate.

According to the present invention, the substrate processing apparatus comprises a first gas discharge element spraying the gas to the surface of the substrate wet with the deionized water and a second gas discharge element further spraying the gas to the same region as the region already sprayed with the gas by the first gas discharge element.

The substrate processing apparatus can also completely remove a trace of moisture remaining on the surface of the substrate for stably and reliably drying the surface of the substrate.

According to an aspect of the present invention, the substrate processing apparatus comprises a first nozzle spraying the gas to the surface of the substrate wet with the deionized water, a second nozzle spraying the gas to the surface of the substrate, a nozzle arm fixedly provided with the first nozzle and the second nozzle and a moving element moving the nozzle arm in a plane substantially parallel to the substrate, while the moving element moves the nozzle arm to spray the gas from the second nozzle to the same region as the region on the substrate sprayed with the gas by the first nozzle.

The second nozzle sprays the gas to the same region as that on the substrate sprayed with the gas by the first nozzle, whereby the substrate processing apparatus can also completely remove a trace of moisture remaining on the surface of the substrate for stably and reliably drying the surface of the substrate.

According to another aspect of the present invention, the substrate processing apparatus comprises a nozzle spraying the gas to the surface of the substrate wet with the deionized water, a nozzle arm fixedly provided with the nozzle and a moving element moving the nozzle arm in a plane parallel to the substrate, while the moving element moves the nozzle arm to re-spray the gas from the nozzle to the same region as the region on the substrate sprayed with the gas by the nozzle.

The nozzle re-sprays the gas to the same region as that on the substrate sprayed with the gas by the nozzle, whereby the substrate processing apparatus can also completely remove a trace of moisture remaining on the surface of the substrate for stably and reliably drying the surface of the substrate.

The present invention is also directed to a substrate processing method spraying gas to a substrate completely cleaned with deionized water for drying the substrate.

Accordingly, an object of the present invention is to provide a substrate processing apparatus and a substrate processing method capable of stably and reliably drying the surface of a substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described in detail with reference to the drawings.

<1. First Embodiment>

Figure 1:
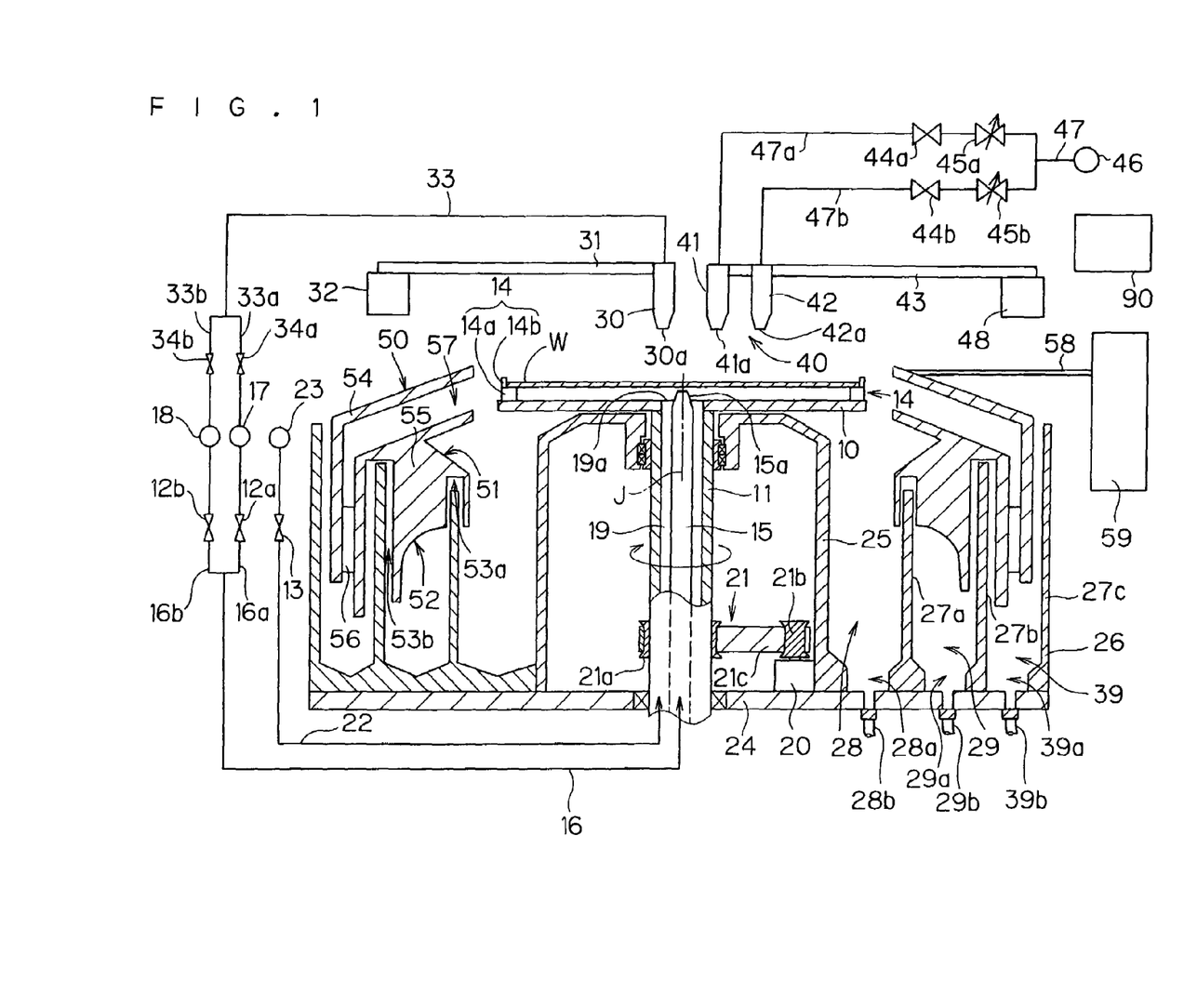
FIG. 1 is a longitudinal sectional view showing the structure of a substrate processing apparatus according to a first embodiment of the present invention.

FIG. 1 is a longitudinal sectional view showing the structure of a substrate processing apparatus according to a first embodiment of the present invention. The substrate processing apparatus according to the first embodiment is a single-substrate type substrate processing apparatus performing cleaning processing etc. on a substrate W, and mainly comprises a spin base 10 holding the substrate W, a plurality of chuck pins 14 provided on the spin base 10, an electric motor 20 rotating the spin base 10, a processing solution nozzle 30 and a gas nozzle 40 provided above the spin base 10, a splash guard 50 enclosing the substrate W held by the spin base 10, a mechanism supplying a processing solution and gas to the substrate W held on the spin base 10 and a mechanism vertically moving the splash guard 50.

The spin base 10 substantially horizontally holds the substrate W thereon. This spin base 10 is a discoidal member having an opening on its center, and provided on its upper surface with the plurality of chuck pins 14 grasping the peripheral edge of the circular substrate W respectively. The spin base 10 may be provided with at least three chuck pins 14, in order to reliably hold the circular substrate W. FIG. 1 shows only two chuck pins 14 for convenience of illustration.

Each of the chuck pins 14 comprises a substrate support part 14a supporting the peripheral edge of the substrate W from below and a substrate holding part 14b pressing the outer peripheral end surface of the substrate W supported by the substrate support part 14a for holding the substrate W. Each chuck pin 14 is switchable between a pressing state where the substrate holding part 14b presses the outer peripheral end surface of the substrate W and an open state where the substrate holding part 14b separates from the outer peripheral end surface of the substrate W. In order to switch the plurality of chuck pins 14 between the pressing state and the open state, the substrate processing apparatus may employ any known mechanism such as a link mechanism rotating the plurality of chuck pins 14 in an interlocking manner, for example.

In order to transfer or receive the substrate W to or from the spin base 10, the substrate processing apparatus brings the chuck pins 14 into the open state. In order to perform processing described later on the substrate W, on the other hand, the substrate processing apparatus brings the chuck pins 14 into the pressing state. When brought into the pressing state, the plurality of chuck pins 14 grasp the peripheral edge of the substrate W for horizontally holding the substrate W at a prescribed interval from the spin base 10. The substrate W is held in a state directing the front and rear surfaces thereof upward and downward respectively. When the chuck pins 14 are brought into the pressing state for holding the substrate W, the upper ends of the substrate holding parts 14b project upward beyond the upper surface of the substrate W, in order to reliably hold the substrate W so that the same will not fall from the chuck pins 14 in processing.

A rotary shaft 11 is suspended from the lower surface of the center of the spin base 10. This rotary shaft 11 is a hollow cylindrical member, and a lower processing solution nozzle 15 is inserted into the inner hollow portion thereof. The electric motor 20 is interlocked/coupled with a portion close to the lower end of the rotary shaft 11 through a belt drive mechanism 21. In other words, a belt 21c is extended between an idler pulley 21a fixedly provided on the outer periphery of the rotary shaft 11 and a driving pulley 21b coupled to the rotation axis of the electric motor 20. The driving force of the electric motor 20 is transmitted to the rotary shaft 11 through the belt drive mechanism 21 for rotating the rotary shaft 11, the spin base 10 and the substrate W held by the same about an axis J along the vertical direction in a horizontal plane.

The lower processing solution nozzle 15 passes through the rotary shaft 11, so that its forward end 15a is located immediately under the center of the substrate W held by the spin base 10. The base end of the lower processing solution nozzle 15 is communicatively connected to a processing solution pipe 16. The base end of the processing solution pipe 16 is bifurcated into branch pipes 16a and 16b communicatively connected with a chemical solution supply source 17 and a deionized water supply source 18 respectively. The branch pipes 16a and 16b are provided with valves 12a and 12b provided. The substrate processing apparatus can selectively switch and discharge/supply a chemical solution or deionized water from the forward end 15a of the lower processing solution nozzle 15 to a portion around the center of the lower surface of the substrate W held by the spin base 10 by switching opening/closing of the valves 12a and 12b. In other words, the substrate processing apparatus can supply the chemical solution from the lower processing solution nozzle 15 by opening the valve 12a and closing the valve 12b, and can supply the deionized water from the lower processing solution nozzle 15 by opening the valve 12b and closing the valve 12a. The substrate processing apparatus uses hydrofluoric acid (HF), hydrochloric acid (HCl), SC2 (mixed solution of hydrochloric acid, hydrogen peroxide water and water) or the like, for example, as the chemical solution.

A clearance between the inner walls of the hollow portion of the rotary shaft 11 and the opening of the spin base 10 and the outer wall of the lower processing solution nozzle 15 defines a gas supply passage 19. A forward end 19a of the gas supply passage 19 is directed to the center of the lower surface of the substrate W held by the spin base 10. The base end of the gas supply passage 19 is communicatively connected to a gas pipe 22. The gas pipe 22 is communicatively connected to an inert gas supply source 23, while a valve 13 is provided on an intermediate portion of the path of the gas pipe 22. The substrate processing apparatus can supply inert gas from the forward end 19a of the gas supply passage 19 to the center of the lower surface of the substrate W held by the spin base 10 by opening the valve 13. The substrate processing apparatus uses nitrogen gas ($N_2$), for example, as the inert gas.

The rotary shaft 11, the belt drive mechanism 21, the electric motor 20 etc. described above are stored in a cylindrical casing 25 provided on a base member 24.

A receiving member 26 is fixedly mounted on the periphery of the casing 25 provided on the base member 24. Cylindrical partition members 27a, 27b and 27c are uprightly provided on the base member 24 as the receiving member 26. A space between the outer wall of the casing 25 and the inner wall of the partition member 27a forms a first discharge tank 28, a space between the outer wall of the partition member 27a and the inner wall of the partition member 27b forms a second discharge tank 29 and a space between the outer wall of the partition member 27b and the inner wall of the partition member 27c forms a third discharge tank 39.

An outlet 28a communicatively connected to a disposal drain 28b is provided on the bottom of the first discharge tank 28. Spent deionized water and gas are discharged from the outlet 28a of the first discharge tank 28 to the disposal drain 28b. The deionized water and the gas discharged to the disposal drain 28b are separated from each other and thereafter disposed according to prescribed procedures respectively.

An outlet 29a communicatively connected to a discharge drain 29b is provided on the bottom of the second discharge tank 29. A spent chemical solution is discharged from the outlet 29a of the second discharge tank 29 to the discharge drain 29b. The chemical solution discharged to the discharge drain 29b is discharged to a discharge line (not shown).

An outlet 39a communicatively connected to a recovery drain 39b is provided on the bottom of the third discharge tank 39. Another spent chemical solution is discharged from the outlet 39a of the third discharge tank 39 to the recovery drain 39b. The chemical solution discharged to the recovery drain 39b is recovered by a recovery tank (not shown) so that the recovered chemical solution is supplied from the recovery tank to the chemical solution supply source 17 to be circulated/recycled.

The splash guard 50 is provided above the receiving member 26. The splash guard 50 is a cylindrical member, which is arranged to enclose the spin base 10 and the substrate W held by the same. The splash guard 50 is formed by an outer side portion 54 and an inner side portion 55. The outer side portion 54 and the inner side portion 55 are coupled with each other by a coupling member 56, which is only partially arranged for circumferentially forming a discharge guide channel. A clearance between the outer side portion 54 and the inner side portion 55 coupled with each other by the coupling member 56 forms a recovery port 57, whose diameter is reduced upward. The inner side portion 55 of the splash guard 50 is formed with a first receiving part 51 having a V-shaped section and a second receiving part 52 having an arcuate section, and provided with annular grooves 53a and 53b.

The splash guard 50 is coupled with a guard moving mechanism 59 through a link member 58, and rendered vertically movable by the guard moving mechanism 59. The guard moving mechanism 59 can be formed by any known mechanism such as a feed screw mechanism employing a ball screw or a mechanism employing an air cylinder.

When the guard moving mechanism 59 moves down the splash guard 50 to the lowermost position, the partition members 27a and 27b are loosely fitted with the grooves 53a and 53b while the upper end of the splash guard 50 is located downward beyond the spin base 10 and the substrate W held by the same so that the substrate W is introducible. When the guard moving mechanism 59 thereafter slightly moves up the splash guard 50, the recovery port 57 is located around the substrate W (the state shown in FIG. 1). The substrate processing apparatus implements this state in etching processing for recovering/recycling the chemical solution, so that the chemical solution scattered from the rotated substrate W etc. is received by the recovery port 57, passes through the coupling member 56, flows into the third discharge tank 39, is guided to the outlet 39a and thereafter discharged from the outlet 39a to the recovery drain 39b.

When the guard moving mechanism 59 slightly moves up the splash guard 50 from the state shown in FIG. 1, it follows that the first receiving part 51 is located around the spin base 10 and the substrate W held by the same. The substrate processing apparatus implements this state in deionized water rinse processing, so that the deionized water scattered from the rotated substrate W etc. is received by the first receiving part 51, flows into the first discharge tank 28 along its inclination, is guided to the outlet 28a and thereafter discharged from the outlet 28a to the disposal drain 28b.

When the guard moving mechanism 59 further moves up the splash guard 50, it follows that the partition members 27a and 27b separate from the grooves 53a and 53b respectively while the second receiving part 52 is located around the spin base 10 and the substrate W held by the same. The substrate processing apparatus implements this state in etching processing for disposing the chemical solution, so that the chemical solution scattered from the rotated substrate W etc. is received by the second receiving part 52, flows into the second discharge tank 29 along its curved surface, is guided to the outlet 29a and thereafter discharged from the outlet 29a to the discharge drain 29b.

The processing solution nozzle 30 is provided above the spin base 10. The processing solution nozzle 30 is fixed to the forward end of a nozzle arm 31 while directing its discharge port 30a vertically downward. The base end of the nozzle arm 31 is coupled to the rotation axis of a rotary motor 32. The rotary motor 32 rotates the nozzle arm 31 and the processing solution nozzle 30 in a horizontal plane.

A nozzle moving mechanism (not shown) renders the rotary motor 32 vertically movable. Therefore, the processing solution nozzle 30 performs rotation about the rotation axis of the rotary motor 32 in the horizontal plane and vertical movement. Due to such operations, the processing solution nozzle 30 is movable between a position (discharge position) located above the rotation center of the substrate W held by the spin base 10 and an upper position (retreating position) outside the splash guard 50.

The processing solution nozzle 30 is communicatively connected to a processing solution pipe 33. The base end of the processing solution pipe 33 is bifurcated into branch pipes 33a and 33b communicatively connected with the chemical solution supply source 17 and the deionized water supply source 18 respectively. The branch pipes 33a and 33b are provided with valves 34a and 34b. The substrate processing apparatus can selectively switch and discharge/supply the chemical solution or the deionized water from the discharge port 30a of the processing solution nozzle 30 to the upper surface of the substrate W held by the chuck pins 14 by switching opening/closing of the valves 34a and 34b. In other words, the substrate processing apparatus can supply the chemical solution from the processing solution nozzle 30 by opening the valve 34a and closing the valve 34b, and can supply the deionized water from the processing solution nozzle 30 by opening the valve 34b and closing the valve 34a.

The processing nozzle 30 may be formed not by a single nozzle but by a chemical solution nozzle dedicated to the chemical solution and a deionized water nozzle dedicated to the deionized water.

A gas nozzle 40 is also provided above the spin base 10. This gas nozzle 40 is formed by a first gas nozzle 41 and a second gas nozzle 42. The first gas nozzle 41 is fixed to a portion around the forward end of the nozzle arm 43 while directing its discharge port 41a vertically downward. The second gas nozzle 42 is also fixed to a portion around the forward end of the nozzle arm 43 while directing its discharge port 42a vertically downward. In other words, the first and second gas nozzles 41 and 42 are fixed to the same nozzle arm 43. The base end of the nozzle arm 43 is coupled to the rotation axis of a rotary motor 48. The rotary motor 48 rotates the first and second gas nozzles 41 and 42 and the nozzle arm 34 in a horizontal plane.

A nozzle moving mechanism (not shown) renders the rotary motor 48 vertically movable. The nozzle moving mechanism vertically moves the rotary motor 48, thereby vertically moving the first and second gas nozzle 41 and 42 and the nozzle arm 43 coupled to the rotary motor 48. Therefore, the first and second gas nozzles 41 and 42 perform rotation about the rotation axis of the rotary motor 48 in the horizontal plane and vertical movement. Due to such operations, the first and second gas nozzles 41 and 42 are movable between a position (discharge position) located above the rotation center of the substrate W held by the spin base 10 and an upper position (retreating position) outside the splash guard 50.

Figure 2:
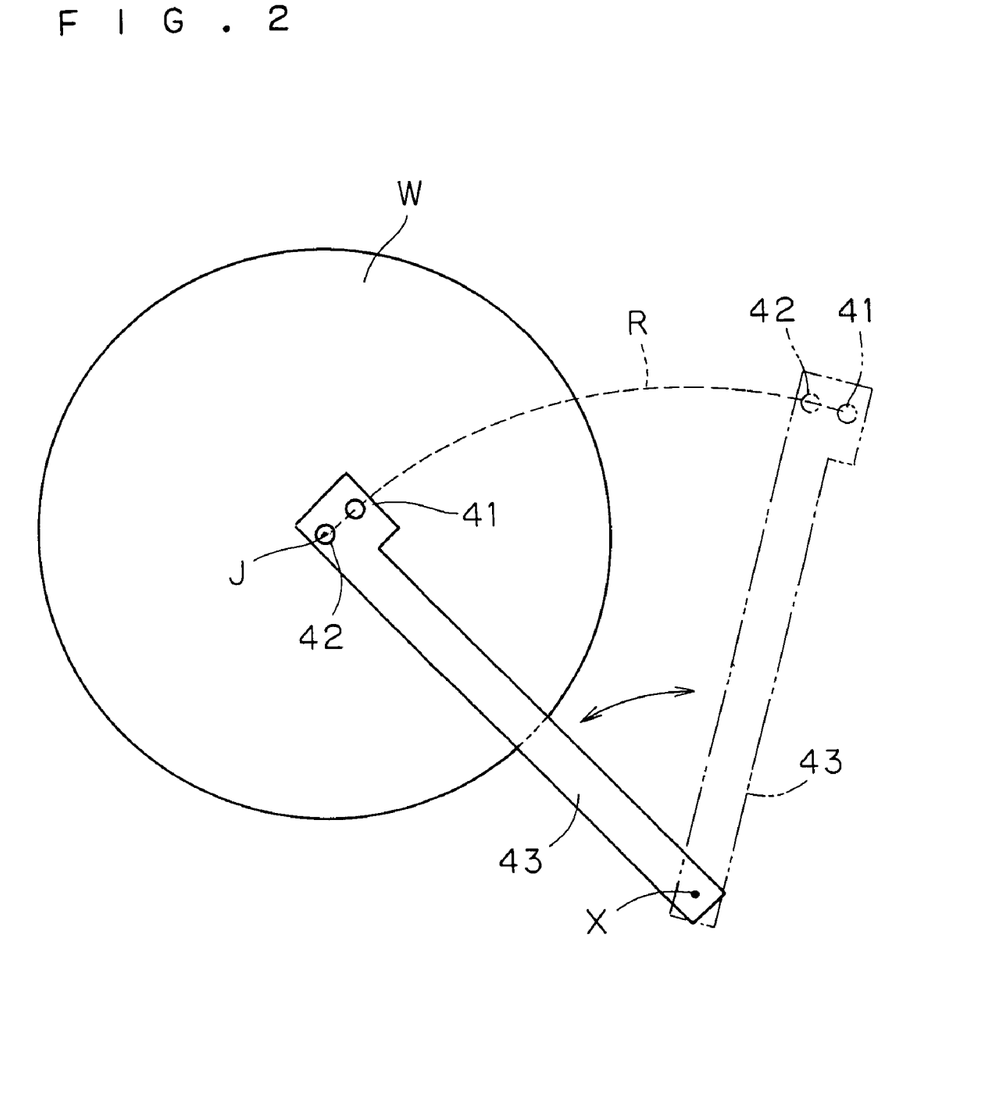
FIG. 2 illustrates movement of a first gas nozzle and a second gas nozzle in a horizontal plane.

FIG. 2 shows the first and second gas nozzles 41 and 42 moved in the horizontal plane. As hereinabove described, the substrate W is rotated by the electric motor 20 about the vertical axis J in the horizontal plane. On the other hand, the first and second gas nozzles 41 and 42 are rotated by the rotary motor 48 about a vertical axis X in the horizontal plane. The first and second gas nozzles 41 and 42 are fixed to the nozzle arm 43 equidistantly from the axis X. As shown in FIG. 2, therefore, both of the first and second gas nozzles 41 and 42 rotated by the rotary motor 48 draw a locus R directed from the rotation center of the substrate W toward the edge.

Both of the first and second nozzles 41 and 42 are communicatively connected to an inert gas supply source 46. In other words, the forward end of a gas pipe 47 is communicatively connected to the inert gas supply source 46 while the base end thereof is bifurcated into branch pipes 47a and 47b communicatively connected to the first and second gas nozzles 41 and 42 respectively. The branch pipe 47a is provided with a valve 44a and a flow control valve 45a. The branch pipe 47b is provided with a valve 44b and a flow control valve 45b.

The substrate processing apparatus can switch presence/absence of discharge of inert gas (e.g., nitrogen gas) from the respective discharge ports 41a and 42a of the first and second gas nozzles 41 and 42 by opening/closing the valves 44a and 44b. In other words, the substrate processing apparatus can discharge and spray the nitrogen gas from the discharge port 41a of the first gas nozzle 41 to the upper surface of the substrate W held by the chuck pins 14 by opening the valve 44a. Similarly, the substrate processing apparatus can discharge and spray the nitrogen gas from the discharge port 42a of the second gas nozzle 42 to the upper surface of the substrate W held by the chuck pins 14 by opening the valve 44b. When opening both of the valves 44a and 44b, the substrate processing apparatus can discharge the nitrogen gas from both of the first and second gas nozzles 41 and 42, as a matter of course.

The flow control valves 45a and 45b have functions of adjusting the flow rates of the nitrogen gas passing through the respective ones of the branch pipes 47a and 47b for controlling the flow rates of the nitrogen gas discharged from the respective ones of the first and second gas nozzles 41 and 42.

A drying control part 90 controls operations of the valves 44a and 44b, the flow control valves 45a and 45b, the rotary motor 48 and the electric motor 20. The drying control part 90 is formed by a computer comprising a CPU, a memory and the like, so that the CPU runs a prescribed processing program thereby controlling the operations of the valves 44a and 44b, the flow control valves 45a and 45b, the rotary motor 48 and the electric motor 20.

The respective ones of the first and second gas nozzles 41 and 42 are fixed to the portions around the forward end of the nozzle arm 43 while directing the discharge ports 41a and 42a vertically downward. Therefore, it follows that the nitrogen gas is discharged from the respective ones of the first and second nozzles 41 and 42 vertically downward. Both of the first and second gas nozzles 41 and 42 rotated by the rotary motor 48 draw the locus R directed from the rotation center (the axis J) of the substrate W toward the edge. Therefore, it follows that the rotary motor 48 rotates the nozzle arm 43 so that arrival points of the gas discharged from the respective ones of the first and second gas nozzles 41 and 42 draw the locus R directed from the rotation center of the rotated substrate W toward the edge.

The procedure of the substrate processing apparatus according to the first embodiment having the aforementioned structure for the substrate W is now described. In summary, the single-substrate type substrate processing apparatus according to the first embodiment performs etching processing on the substrate W with the chemical solution (dilute hydrofluoric acid), thereafter performs rinse processing for washing out the chemical solution with the deionized water, and thereafter performs drying processing on the substrate W.

First, the substrate processing apparatus slightly moves down the splash guard 50 thereby protruding the spin base 10 from the splash guard 50 and moving the processing solution nozzle 30 and the gas nozzle 40 to the retreating positions. In this state, a transport robot (not shown) transfers the unprocessed substrate W to the spin base 10. The chuck pins 14 grasp the peripheral edge of the transferred substrate W thereby horizontally holding the substrate W.

Then, the thermal processing apparatus moves up the splash guard 50 for locating the recovery port 57 around the spin base 10 and the substrate W held by the same while moving the processing solution nozzle 30 to the position located above the rotation center of the substrate W. Then, the thermal processing apparatus rotates the spin base 10 as well as the substrate W held by the same. In this state, the lower processing solution nozzle 15 discharges the chemical solution (dilute hydrofluoric acid) to the lower surface of the substrate W while the processing solution nozzle 30 also discharges the chemical solution to the upper surface of the substrate W. In other words, the substrate processing apparatus supplies the chemical solution to the front and rear surfaces of the rotated substrate W for progressing etching processing. In this etching processing, the gas supply passage 19 may discharge a small quantity of nitrogen gas for preventing the chemical solution from backwardly flowing into the gas supply passage 19.

In the etching processing, the chemical solution scattered from the rotated substrate W is received by the recovery port 57 of the splash guard 50, passes through the coupling member 56 and flows into the third discharge tank 39. The chemical solution flowing into the third discharge tank 39 is discharged from the outlet 39a to the recovery drain 39b and recovered.

When the chemical solution may not be recovered, the substrate processing apparatus moves up the splash guard 50 for locating the second receiving part 52 around the spin base 10 and the substrate W held by the same. The chemical solution received by the second receiving part 52 flows into the second discharge tank 29, and is discharged from the outlet 29a to the discharge drain 29b.

After completion of the etching processing performed for a prescribed time, the substrate processing apparatus stops discharging the chemical solution from the lower processing solution nozzle 15 and the processing solution nozzle 30 and moves up the splash guard 50 for locating the first receiving part 51 around the spin base 10 and the substrate W held by the same. The processing solution nozzle 30 remains on the position located above the rotation center of the substrate W. In this state, the processing solution nozzle 30 and the lower processing solution nozzle 15 discharge the deionized water to the upper and lower surfaces of the rotated substrate W. The discharged deionized water spreads entirely over the front and rear surfaces of the substrate W due to centrifugal force of rotation, to progress cleaning processing (rinse processing) for washing out the chemical solution with the deionized water. Also in the rinse processing, the gas supply passage 19 may discharge a small quantity of nitrogen gas for preventing the deionized water from backwardly flowing into the gas supply passage 19.

In the rinse processing, the deionized water scattered from the rotated substrate W is received by the first receiving part 51 of the splash guard 50 and flows into the first discharge tank 28 along its inclination. The deionized water flowing into the first discharge tank 28 is discharged from the outlet 28a to the disposal drain 28b.

After completion of the rinse processing performed for a prescribed time, the substrate processing apparatus stops discharging the deionized water from the processing solution nozzle 30 and the lower processing solution nozzle 15 and slightly moves down the splash guard 50 for slightly protruding the spin base 10 from the splash guard 50. In consideration of prevention of water marks, it is preferable to reduce the rotational frequency for the substrate W immediately before stopping discharging the deionized water for paddling the deionized water on the upper surface of the substrate W before completing the rinse processing.

The substrate processing apparatus moves the processing solution nozzle 30 to the retreating position while moving the gas nozzle 40 to the position located above the rotation center of the substrate W. At this time, the drying control part 90 controls the rotary motor 48 for locating the first gas nozzle 41 immediately above the rotation center of the substrate W (above the axis J). In drying processing described later, the drying control part 90 controls operations of the valves 44a and 44b, the flow control valves 45a and 45b, the rotary motor 48 and the electric motor 20.

After locating the first gas nozzle 41 immediately above the rotation center of the substrate W, the substrate processing apparatus starts discharging the nitrogen gas from the first gas nozzle 41 while starting rotating the first gas nozzle 41 along the locus R (see FIG. 2) directed from immediately above the rotation center of the substrate W toward the edge. At this time, the substrate processing apparatus rotates the spin base 10 along with the substrate W held by the same. In this stage, the second gas nozzle 42 discharges no gas.

Figure 3:
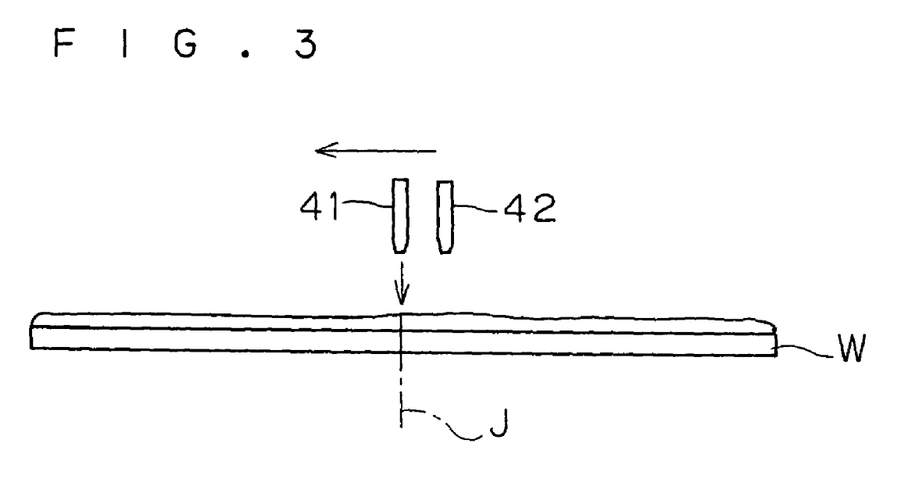
FIG. 3 illustrates the first gas nozzle starting discharging nitrogen gas.

FIG. 3 shows the first gas nozzle 41 starting discharging the nitrogen gas. The substrate processing apparatus sprays the nitrogen gas to the rotation center of the substrate W from the first gas nozzle 41 while rotating the substrate W thereby expelling moisture from the rotation center toward the edge. The substrate processing apparatus moves the first gas nozzle 41 discharging the nitrogen gas toward the edge of the substrate W along the locus R thereby increasing the expelled area of the substrate W. Such an expelled area is substantially circularly shaped as viewed from above due to the continuous rotation of the substrate W.

It is important to expel moisture by gradually ejecting the deionized water heaped on the substrate W toward the edge by centrifugal force resulting from rotation of the substrate W and discharge of the nitrogen gas from the first gas nozzle 41, and it is unpreferable to abruptly expel the moisture. This is because the moisture may scatter and re-adhere to the substrate W to newly cause imperfect drying if abruptly expelled. In order to implement such gentle moisture expulsion, the rotational frequency for the substrate W is relatively lowly set to 10 rpm to 360 rpm, desirably set to 20 rpm to 260 rpm in the drying processing. Further, the flow rate for discharging the nitrogen gas from the first gas nozzle 41 is set to at least 5 l/min., desirably 10 l/min. to 80 l/min. In addition, the traveling speed of the first gas nozzle 41 along the locus R is set to 3 mm/sec. to 200 mm/sec., desirably 6 mm/sec. to 150 mm/sec. when the diameter of the substrate W is $\phi$200 mm.

The first and second gas nozzles 41 and 42 fixed to the same nozzle arm 43 are simultaneously rotated along the locus R. Therefore, the second gas nozzle 42 reaches the position immediately above the rotation center of the substrate W, immediately after the first gas nozzle 41 starts moving from the position immediately above the rotation center of the substrate W. When reaching the position immediately above the rotation center of the substrate W, the second gas nozzle 42 starts discharging the nitrogen gas.

Figure 4:
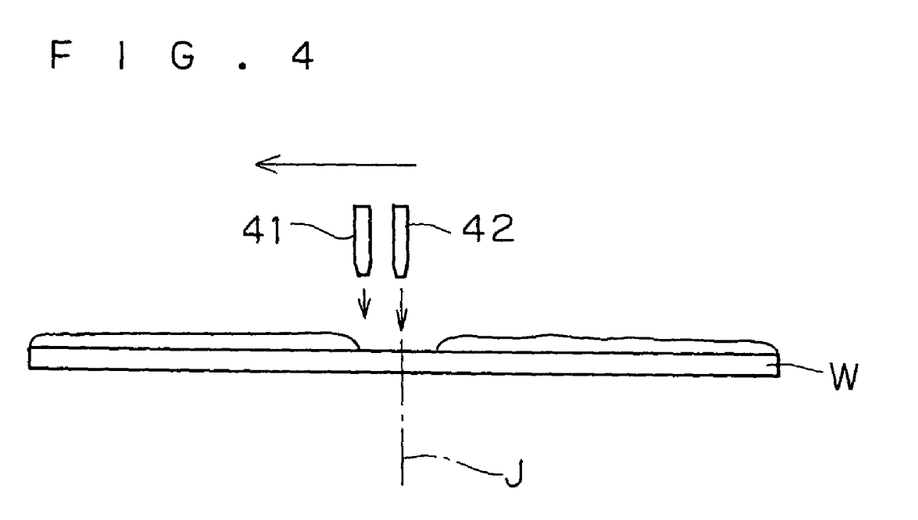
FIG. 4 illustrates the second gas nozzle located immediately above the rotation center of a substrate W.

FIG. 4 shows the second gas nozzle 42 located immediately above the rotation center of the substrate W. The second gas nozzle 42 sprays the nitrogen gas to the area, already expelled by the nitrogen gas sprayed from the first gas nozzle 41, around the rotation center of the substrate W. In the area expelled by the nitrogen gas sprayed from the first gas nozzle 41, moisture infiltrating into a clearance of a fine pattern or the like may not be readily dried but remain in a trace. The substrate processing apparatus can also completely expel such a trace of moisture remaining on the fine pattern or the like by spraying the nitrogen gas from the second gas nozzle 42 to the aforementioned area.

In other words, the nitrogen gas discharge from the first gas nozzle 41 and that discharged from the second gas nozzle 42 have different roles, such that the first gas nozzle 41 discharges the nitrogen gas in order to loosely expel visible moisture and the second gas nozzle 42 discharges the nitrogen gas in order to completely remove a trace of moisture remaining on the fine pattern or the like. Therefore, the flow rate of the nitrogen gas sprayed from the second gas nozzle 42 to the substrate W is larger than that of the nitrogen gas sprayed from the first gas nozzle 41 to the substrate W. More specifically, the flow rate of the nitrogen gas discharged from the second gas nozzle 42 is set to at least 5 l/min., desirably at least 20 l/min. to 200 l/min. The substrate processing apparatus continuously discharges the nitrogen gas from the first gas nozzle 41 also after starting discharging the nitrogen gas from the second gas nozzle 42, for continuously expelling the moisture heaped on the substrate W. The substrate processing apparatus also continuously rotates the substrate W and moves the first and second gas nozzles 41 and 42 toward the edge of the substrate W along the locus R.

Figure 5:
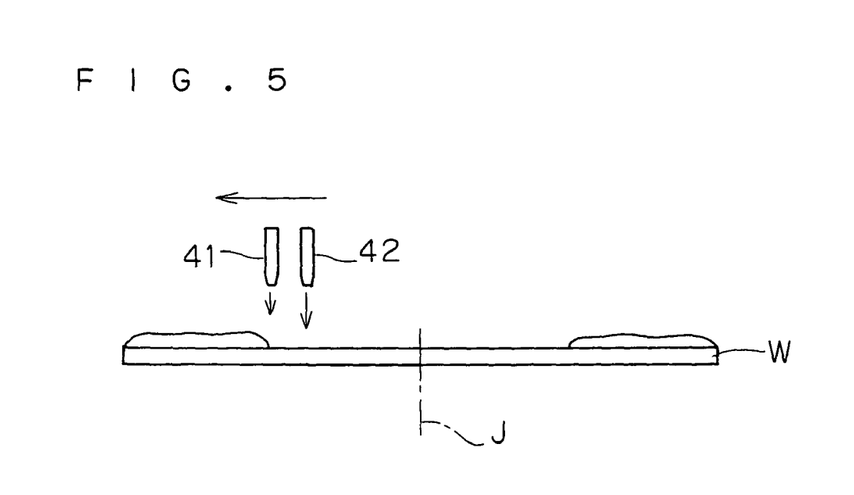
FIG. 5 illustrates a process of movement of the first gas nozzle and the second gas nozzle moving from immediately above the rotation center of the substrate toward the edge.

FIG. 5 illustrates the process of movement of the first and second gas nozzles 41 and 42 from immediately above the rotation center of the substrate W toward the edge. The substrate processing apparatus rotates the nozzle arm 43 while discharging the nitrogen gas from both of the first and second gas nozzles 41 and 42, thereby gradually expelling the moisture remaining on the substrate W toward the edge due to the nitrogen gas sprayed from the first gas nozzle 41 and immediately eliminating a small quantity of residual moisture from the expelled area due to the nitrogen gas sprayed from the second gas nozzle 42.

When the first gas nozzle 41 reaches a position located immediately above the edge of the substrate W, the substrate processing apparatus stops discharging the nitrogen gas from the first gas nozzle 41. At this time, the substrate processing apparatus has expelled visible moisture from above the substrate W. The substrate processing apparatus continuously discharges the nitrogen gas from the second gas nozzle 42 and rotating the nozzle arm 43 and the substrate W.

Figure 6:
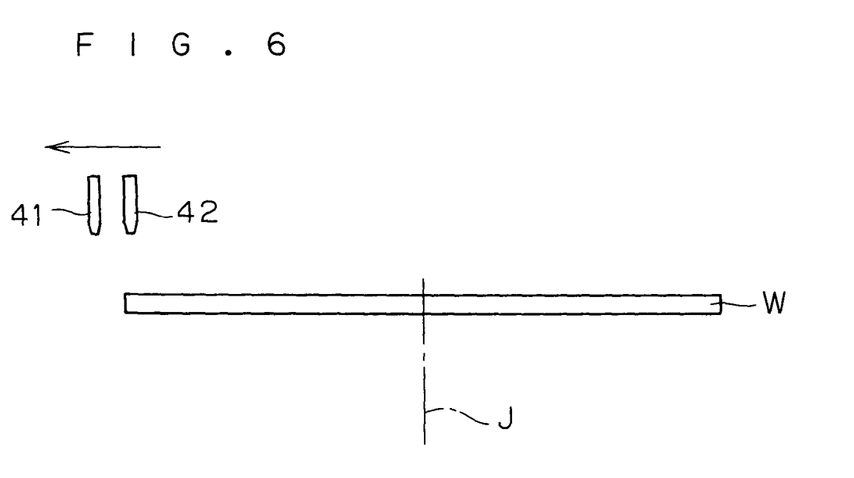
FIG. 6 illustrates the second gas nozzle located immediately above the edge of the substrate.

Thereafter the second gas nozzle 42 immediately reaches the position located immediately above the edge of the substrate W. FIG. 6 illustrates the second gas nozzle 42 located immediately above the edge of the substrate W. When the second gas nozzle 42 reaches the position immediately above the substrate W, the substrate processing apparatus stops discharging the nitrogen gas from the second gas nozzle 42. At this point, the substrate processing apparatus also completely removes a trace of moisture remaining on the overall upper surface of the substrate W.

Thereafter the substrate processing apparatus further increases the rotational frequency for the substrate W for performing finish drying. At this time, the rotational frequency for the substrate W is set to a high level of 800 rpm to 4000 rpm, desirably 1000 rpm to 3000 rpm.

When the finish drying processing performed for a prescribed time is completed, the substrate processing apparatus stops rotating the spin base 10 and the substrate W held by the same. The substrate processing apparatus further moves the processing solution nozzle 30 and the gas nozzle 40 to the retreating positions. At this time, the transport robot (not shown) takes out and discharges the processed substrate W from the spin base 10, thereby terminating the series of processing.

As hereinabove described, the substrate processing apparatus can also completely remove a trace of moisture remaining on the fine pattern or the like by loosely expelling visible moisture from the substrate W by spraying the nitrogen gas from the first gas nozzle 41 and thereafter spraying the nitrogen gas from the second gas nozzle 42 to the same region of the substrate W as that sprayed with the nitrogen gas by the first gas nozzle 41. Consequently, it is possible to quickly and completely remove moisture adhering to the surface of the substrate W without using IPA, for stably and reliably drying the surface of the substrate W.

In order to stably and reliably dry the surface of the substrate W by spraying the nitrogen gas to the same region twice, the interval between the first spraying and the second spraying is preferably minimized. If this interval is long, a trace of moisture remaining on the fine pattern or the like causes imperfect drying. According to the first embodiment, the first and second gas nozzles 41 and 42 are fixed to the same nozzle arm 43, whereby the interval between the first spraying and the second spraying depends on the rotational speed of the nozzle arm 43 and the distance between the first and second gas nozzles 41 and 42. The rotational speed of the nozzle arm 43 (traveling speed of the first gas nozzle 41 along the locus R) is described above. While the distance between the first and second gas nozzles 41 and 42 is preferably minimized in consideration of prevention of water marks, discharged nitrogen gas components may mutually interfere with each other to cause turbulence if the nozzles 41 and 42 are too close to each other. Under the aforementioned conditions, therefore, the distance between the first and second gas nozzles 41 and 42 is set to about 10 mm to 30 mm.

The substrate processing apparatus clearly distinguishes the first and second gas nozzles 41 and 42 into the role of discharging the nitrogen gas for loosely expelling visible moisture and the role of discharging the nitrogen gas for completely removing a trace of moisture remaining on the fine pattern or the like respectively, to be capable of stabilizing drying processing and allowing process conditions (discharge flow rate etc.) in each nozzle some latitude.

Further, the substrate processing apparatus renders the flow rate of the nitrogen gas sprayed from the second gas nozzle 42 to the substrate W larger than that of the nitrogen gas sprayed from the first gas nozzle 41 to the substrate W thereby ensuring gradual expulsion of visible moisture and complete removal of moisture remaining in a trace.

In addition, the substrate processing apparatus rotates the substrate W while the arrival point of the nitrogen gas discharged from each of the first and second gas nozzles 41 and 42 draws the locus R directed from the rotation center of the substrate W toward the edge, whereby it follows that each of the first and second gas nozzles 41 and 42 sprays the nitrogen gas to the overall surface of the substrate W so that the substrate processing apparatus can stably and reliably dry the overall surface of the substrate W.

<2. Second Embodiment>

Figure 7:
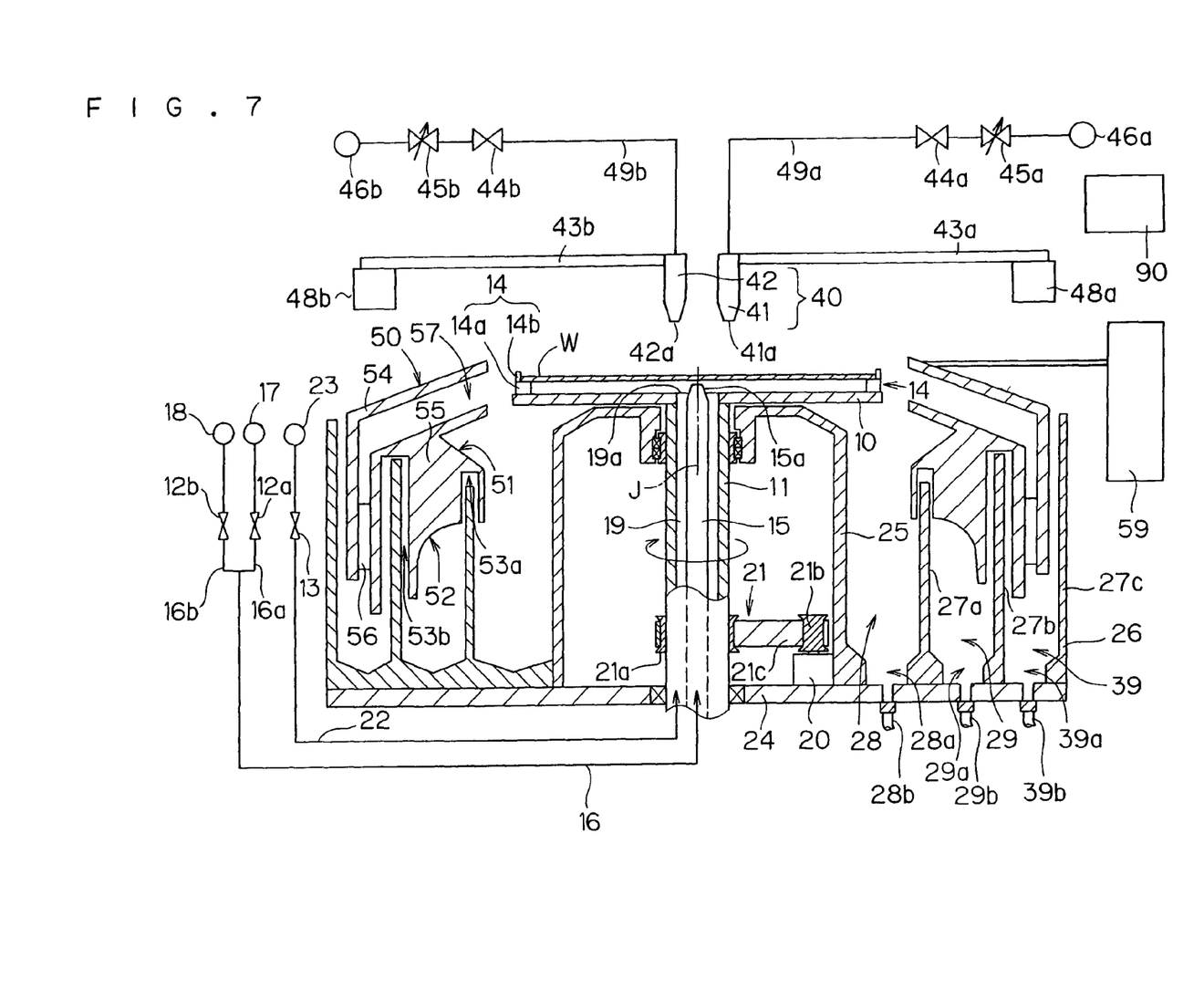
FIG. 7 is a longitudinal sectional view showing the structure of a substrate processing apparatus according to a second embodiment of the present invention.

A second embodiment of the present invention is now described. FIG. 7 is a longitudinal sectional view showing the structure of a substrate processing apparatus according to the second embodiment. Referring to FIG. 7, members identical to those of the substrate processing apparatus according to the first embodiment are denoted by the same reference numerals, to omit redundant description. The structure of the substrate processing apparatus according to the second embodiment is different from that of the substrate processing apparatus according to the first embodiment in a set mode of a gas nozzle 40, and the remaining points of the former are identical to those of the latter. While FIG. 7 shows no processing solution nozzle 30 for convenience of illustration, the substrate processing apparatus according to the second embodiment has a processing solution nozzle 30 similar to that in the substrate processing apparatus according to the first embodiment.

The gas nozzle 40 is formed by a first gas nozzle 41 and a second gas nozzle 42, which are fixed to different nozzle arms 43*a* and 43*b* respectively in the second embodiment. The first gas nozzle 41 is fixed to a portion close to the forward end of the nozzle arm 43*a* while directing its discharge port 41*a* vertically downward. The base end of the nozzle arm 43*a* is coupled to the rotation axis of a rotary motor 48*a*. The rotary motor 48*a* rotates the first gas nozzle 41 and the nozzle arm 43*a* in a horizontal plane.

A nozzle moving mechanism (not shown) renders the rotary motor 48*a* vertically movable. The nozzle moving mechanism vertically moves the rotary motor 48*a*, thereby also vertically moving the first gas nozzle 41 and the nozzle arm 43*a* coupled to the rotary motor 48*a*. Therefore, the first gas nozzle 41 performs rotation in the horizontal plane about the rotation axis of the rotary motor 48*a* and vertical movement. Due to such operations, the first gas nozzle 41 is movable between a position (discharge position) located above the rotation center of a substrate W held by a spin base 10 and an upper position (retreating position) outside a splash guard 50.

On the other hand, the second gas nozzle 42 is fixed to a portion close to the forward end of the nozzle arm 43*b* while directing its discharge port 42a vertically downward. The base end of the nozzle arm 43b is coupled to the rotation axis of a rotary motor 48b. The rotary motor 48b rotates the second gas nozzle 42 and the nozzle arm 43b in a horizontal plane.

Another nozzle moving mechanism (not shown) also renders the rotary motor 48b vertically movable. The nozzle moving mechanism vertically moves the rotary motor 48b, thereby also vertically moving the second gas nozzle 42 and the nozzle arm 43b coupled to the rotary motor 48b. Therefore, the second gas nozzle 42 performs rotation in the horizontal plane about the rotation axis of the rotary motor 48b and vertical movement. Due to such operations, the second gas nozzle 42 is also movable between the position (discharge position) located above the rotation center of the substrate W held by the spin base 10 and the upper position (retreating position) outside the splash guard 50.

Figure 8:
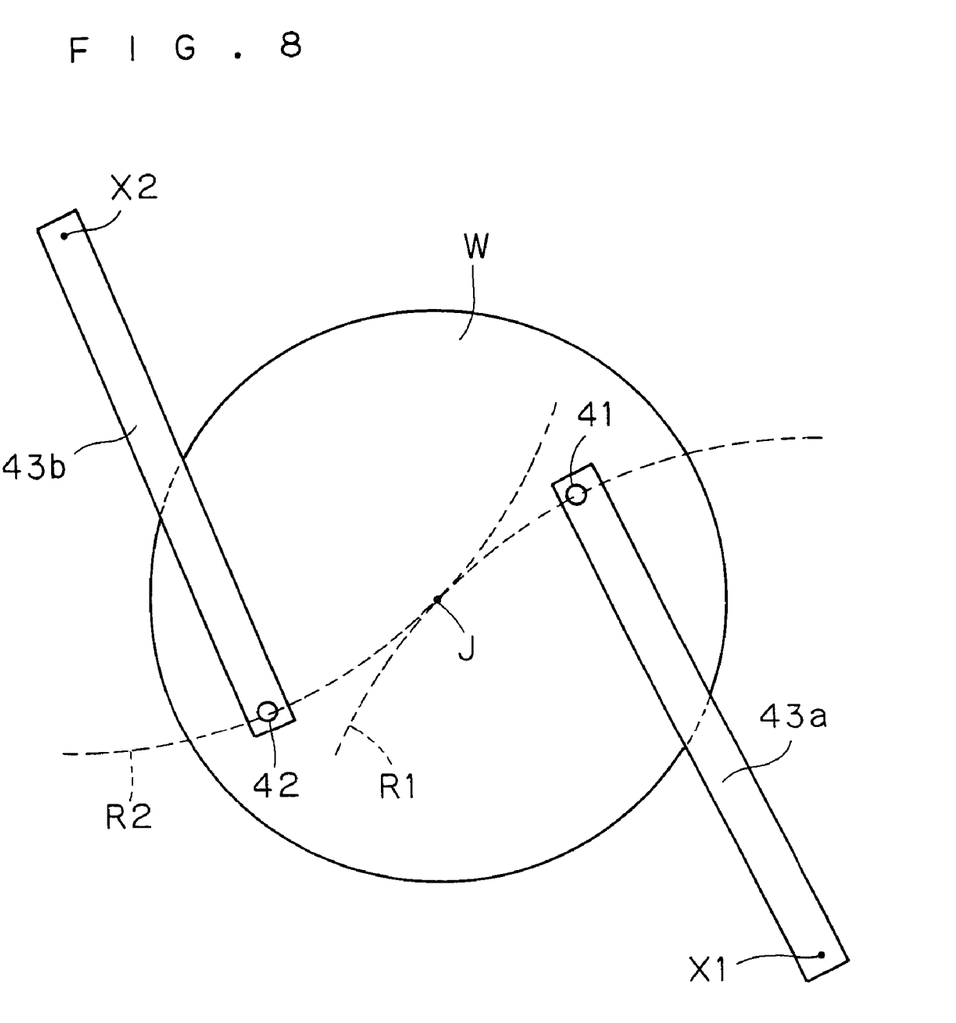
FIG. 8 illustrates movement of a first gas nozzle and a second gas nozzle of the substrate processing apparatus according to the second embodiment in a horizontal plane.

FIG. 8 illustrates movement of the first and second gas nozzles 41 and 42 according to the second embodiment in the horizontal plane. Similarly to the first embodiment, an electric motor 20 rotates the substrate W about a vertical axis J in the horizontal plane. On the other hand, the rotary motors 48a and 48b rotate the first and second gas nozzles 41 and 42 in the horizontal plane about vertical axes X1 and X2 respectively. Both of the first and second gas nozzles 41 and 42 are rotated to pass through the rotation center of the substrate W. In other words, the first gas nozzle 41 rotated by the rotary motor 48a draws a locus R1 directed from the rotation center (axis J) of the substrate W toward the edge while the second gas nozzle 42 rotated by the rotary motor 48b draws another locus R2 directed from the rotation center of the substrate W toward the edge, as shown in FIG. 8.

The first and second gas nozzles 41 and 42 are communicatively connected to inert gas supply sources 46a and 46b respectively. In other words, the forward end of a gas pipe 49a is communicatively connected to the inert gas supply source 46a while its base end is communicatively connected to the first gas nozzle 41. Similarly, the forward end of a gas pipe 49b is communicatively connected to the inert gas supply source 46b while its base end is communicatively connected to the second gas nozzle 42. The gas pipe 49a is provided with a valve 44a and a flow control valve 45a. The gas pipe 49b is provided with a valve 44b and a flow control valve 45b.

The substrate processing apparatus can switch presence/absence of discharge of inert gas (e.g., nitrogen gas) from the discharge ports 41a and 42a of the first and second gas nozzles 41 and 42 by opening/closing the valves 44a and 44b. In other words, the substrate processing apparatus can discharge and spray the nitrogen gas from the discharge port 41a of the first gas nozzle 41 to the upper surface of the substrate W held by chuck pins 14 by opening the valve 44a. Similarly, the substrate processing apparatus can discharge and spray the nitrogen gas from the discharge port 42a of the second gas nozzle 42 to the upper surface of the substrate W held by the chuck pins 14 by opening the valve 44b. When opening both of the valves 44a and 44b, the substrate processing apparatus can discharge the nitrogen gas from both of the first and second gas nozzles 41 and 42, as a matter of course.

The flow control valves 45a and 45b have functions of adjusting the flow rates of the nitrogen gas passing through the gas pipes 49a and 49b respectively thereby controlling the flow rates of the nitrogen gas discharged from the first and second gas nozzles 41 and 42 respectively. Similarly to the first embodiment, a drying control part 90 controls operations of the valves 44a and 44b, the flow control valves 45a and 45b, the rotary motors 48a and 48b and the electric motor 20.

The respective ones of the first and second gas nozzles 41 and 42 are fixed to the portions close to the forward ends of the nozzle arms 43a and 43b while directing the discharge ports 41a and 42a vertically downward. Therefore, it follows that the respective ones of the first and second gas nozzles 41 and 42 discharge the nitrogen gas vertically downward. Further, the first and second gas nozzles 41 and 42 rotated by the rotary motors 48a and 48b respectively draw the loci R1 and R2 both directed from the rotation center (axis J) of the substrate W toward the edge. Therefore, it follows that the rotary motors 48a and 48b rotate the nozzle arms 43a and 43b respectively so that arrival points of the gas discharged from the respective ones of the first and second gas nozzles 41 and 42 draw the loci R1 and R2 directed from the rotation center of the rotated substrate W toward the edge.

Thus, it follows that the first and second gas nozzles 41 and 42 are rotated mutually independently of each other according to the second embodiment. A procedure of the substrate processing apparatus according to the second embodiment for the substrate W is now described. The outline of the procedure in the single-substrate type substrate processing apparatus according to the second embodiment is to perform etching processing with a chemical solution (dilute hydrofluoric acid) on the substrate W, thereafter perform rinse processing of washing out the chemical solution with deionized water and thereafter perform drying processing of the substrate W, similarly to the first embodiment. The processing up to the rinse processing is absolutely identical to that in the first embodiment, and hence redundant description is omitted.

After completion of the rinse processing, the substrate processing apparatus moves the processing solution nozzle 30 to the retreating position while the rotary motor 48a rotates the nozzle arm 43a to locate the first gas nozzle 41 on the position immediately above the rotation center (axis J) of the substrate W.

After locating the first gas nozzle 41 immediately above the rotation center of the substrate W, the substrate processing apparatus starts discharging the nitrogen gas from the first gas nozzle 41 while starting rotating the first gas nozzle 41 along the locus R1 from immediately above the rotation center of the substrate W toward the edge. At this time, the substrate processing apparatus rotates the spin base 10 and the substrate W held by the same.

The substrate processing apparatus sprays the nitrogen gas to the rotation center of the substrate W from the first gas nozzle 41 while rotating the substrate W, thereby expelling moisture from the rotation center toward the edge. The substrate processing apparatus moves the first gas nozzle 41 discharging the nitrogen gas toward the edge of the substrate W along the locus R1, thereby increasing the expelled area of the substrate W. Such an expelled area is substantially circularly shaped as viewed from above due to continuous rotation of the substrate W.

Also in the second embodiment, the first gas nozzle 41 plays the role of gradually ejecting visible moisture remaining on the substrate W toward the edge, similarly to that in the first embodiment. Therefore, the substrate processing apparatus sets the rotational frequency for the substrate W, the traveling speed of the first gas nozzle 41 and the flow rate of the nitrogen gas discharged from the first gas nozzle 41 similarly to those in the first embodiment.

According to the second embodiment, the substrate processing apparatus drives the first and second gas nozzles 41 and 42 independently of each other while the rotary motor 48b rotates the nozzle arm 43b to locate the second gas nozzle 42 immediately above the rotation center of the substrate W immediately after the substrate processing apparatus starts moving the first gas nozzle 41 from immediately above the rotation center of the substrate W. When locating the second gas nozzle 42 immediately above the rotation center of the substrate W, the substrate processing apparatus starts discharging the nitrogen gas from the second gas nozzle 42 while simultaneously starting rotating the second gas nozzle 42 from immediately above the rotation center of the substrate W to the edge along the locus R2. In order to prevent the first and second gas nozzles 41 and 42 from interference, the substrate processing apparatus preferably rotates the first and second gas nozzles 41 and 42 oppositely through the rotation center of the substrate W. Further, the substrate processing apparatus equalizes the traveling speeds of the first and second gas nozzles 41 and 42 to each other while substantially equalizing the flow rate of the nitrogen gas discharged from the second gas nozzle 42 to that in the first embodiment.

The substrate processing apparatus sprays the nitrogen gas from the second gas nozzle 42 to the area, already expelled by the nitrogen gas sprayed from the first gas nozzle 41, around the rotation center of the substrate W. Thus, the substrate processing apparatus can also completely remove a trace of moisture remaining on a fine pattern or the like, similarly to the first embodiment.

Also in the second embodiment, the nitrogen gas discharge from the first gas nozzle 41 and that from the second gas nozzle 42 have different roles, such that the first gas nozzle 41 discharges the nitrogen gas in order to loosely expel visible moisture while the second gas nozzle 42 discharges the nitrogen gas in order to completely remove a trace of moisture remaining on the fine pattern or the like. Therefore, the flow rate of the nitrogen gas sprayed from the second gas nozzle 42 to the substrate W is larger than that of the nitrogen gas sprayed from the first gas nozzle 41 to the substrate W. The substrate processing apparatus continuously discharges the nitrogen gas from the first gas nozzle 41 also after starting discharging the nitrogen gas from the second gas nozzle 42, for continuously expelling the moisture heaped on the substrate W. The substrate processing apparatus also continuously rotates the substrate W and moves the first and second gas nozzles 41 and 42 toward the edge of the substrate W along the loci R1 and R2 respectively.

Thus, the substrate processing apparatus sprays the gas from the second gas nozzle 42 to the area of the substrate W already sprayed with the nitrogen gas by the first gas nozzle 41, thereby gradually expelling the moisture remaining on the substrate W toward the edge due to the nitrogen gas sprayed from the first gas nozzle 41 and immediately removing a trace of residual moisture from the expelled area due to the nitrogen gas sprayed from the second gas nozzle 42.

When the first gas nozzle 41 reaches a portion immediately above the edge of the substrate W, the substrate processing apparatus stops discharging the nitrogen gas from the first gas nozzle 41. At this time, the substrate processing apparatus expels visible moisture from the substrate W. Thereafter the second gas nozzle 42 immediately reaches the portion immediately above the edge of the substrate W. When the second gas nozzle 42 reaches the portion immediately above the edge of the substrate W, the substrate processing apparatus stops discharging the nitrogen gas from the second gas nozzle 42. At this point of time, the substrate processing apparatus also completely removes moisture remaining in a trace from the overall upper surface of the substrate W.

Thereafter the substrate processing apparatus further increases the rotational frequency for the substrate W for performing finish drying. The subsequent procedure is identical to that in the first embodiment.

Effects similar to those of the first embodiment can be attained also in the aforementioned manner, while the substrate processing apparatus according to the second embodiment can reduce the distance between the rotation center of the substrate W and the first and second gas nozzles 41 and 42 without causing mutual interference between the flows of the nitrogen gas discharged from the first and second gas nozzles 41 and 42. Thus, the substrate processing apparatus can further narrow the time interval between first spraying and second spraying for further stably and reliably drying the surface of the substrate W.

<3. Third Embodiment>

Figure 9:
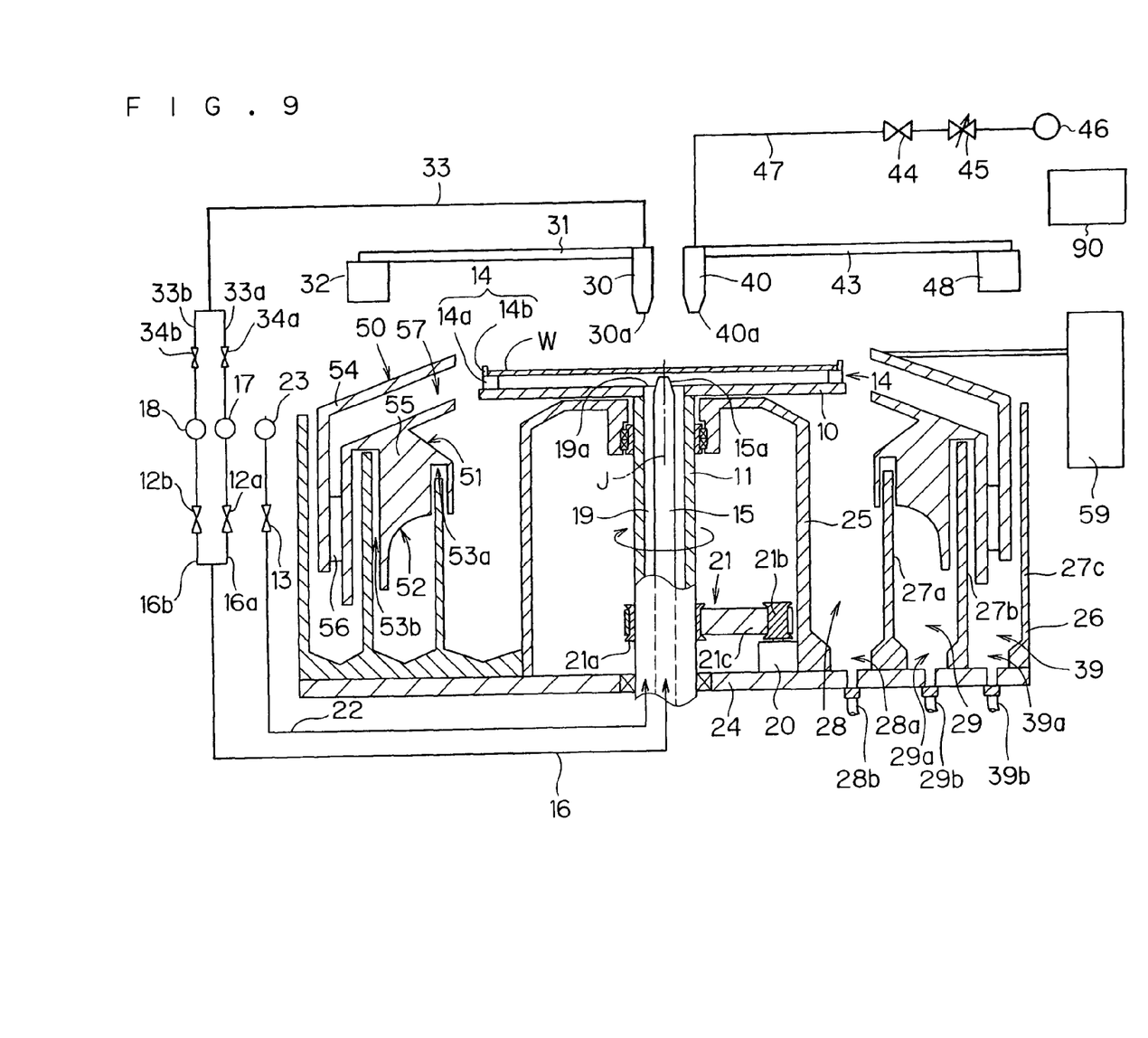
FIG. 9 is a longitudinal sectional view showing the structure of a substrate processing apparatus according to a third embodiment of the present invention.

A third embodiment of the present invention is now described. FIG. 9 is a longitudinal sectional view showing the structure of a substrate processing apparatus according to the third embodiment. Referring to FIG. 9, members identical to those of the substrate processing apparatus according to the first embodiment are denoted by the same reference numerals, to omit redundant description. The structure of the substrate processing apparatus according to the third embodiment is different from that of the substrate processing apparatus according to the first embodiment in a set mode of a gas nozzle 40, and the remaining points of the former are identical to those of the latter.

According to the third embodiment, the gas nozzle 40 is formed by a single nozzle. The gas nozzle 40 is fixed to a portion close to the forward end of a nozzle arm 43 while directing its discharge port 40a vertically downward. The base end of the nozzle arm 43 is coupled to the rotation axis of a rotary motor 48. The rotary motor 48 rotates the gas nozzle 40 and the nozzle arm 43 in a horizontal plane.

A nozzle moving mechanism (not shown) renders the rotary motor 48 vertically movable. The nozzle moving mechanism vertically moves the rotary motor 48, thereby also vertically moving the gas nozzle 40 and the nozzle arm 43 coupled to the rotary motor 48. Therefore, the gas nozzle 40 performs rotation in the horizontal plane about the rotation axis of the rotary motor 48 and vertical movement. Due to such operations, the gas nozzle 40 is also movable between a position (discharge position) located above the rotation center of a substrate W held by a spin base 10 and an upper position (retreating position) outside a splash guard 50.

The mode of movement of the gas nozzle 40 in the horizontal plane is identical to that in the first embodiment (see FIG. 2). In other words, an electric motor 20 rotates the substrate W in the horizontal plane about an axis J along the vertical direction. On the other hand, the rotary motor 48 rotates the gas nozzle 40 in the horizontal plane about an axis along the vertical direction. The gas nozzle 40 rotated by the rotary motor 48 draws a locus directed from the rotation center (axis J) of the substrate W toward the edge.

The gas nozzle 40 is communicatively connected to an inert gas supply source 46. In other words, the forward end of a gas pipe 47 is communicatively connected to the inert gas supply source 46, while its base end is communicatively connected to the gas nozzle 40. The gas pipe 47 is provided with a valve 44 and a flow control valve 45.

The substrate processing apparatus can switch presence/absence of discharge of inert gas (e.g., nitrogen gas) from the discharge port 40a of the gas nozzle 40 by opening/closing the valve 44. In other words, the substrate processing apparatus can discharge and spray the nitrogen gas from the discharge port 40a of the gas nozzle 40 to the upper surface of the substrate W held by chuck pins 41 by opening the valve 44.

The flow control valve 45 has a function of adjusting the flow rate of the nitrogen gas passing through the gas pipe 47 for controlling the flow rate of the nitrogen gas discharged from the gas nozzle 40. A drying control part 90 controls operations of the valve 44, the flow control valve 45, the rotary motor 48 and the electric motor 20, similarly to the first embodiment.

The gas nozzle 40 is fixed to the portion around the forward end of the nozzle arm 43 while directing the discharge port 40a vertically downward. Therefore, it follows that the gas nozzle 40 discharges the nitrogen gas vertically downward. Further, the gas nozzle 40 rotated by the rotary motor 48 draws the locus directed from the rotation center (axis J) of the substrate W toward the edge. Therefore, it also follows that the rotary motor 48 rotates the nozzle arm 43 so that the arrival point of the gas discharged from the gas nozzle 40 draws a locus directed from the rotation center of the rotated substrate W toward the edge.

Thus, it follows that the substrate processing apparatus according to the third embodiment rotates the single gas nozzle 40. The procedure of the substrate processing apparatus according to the third embodiment on the substrate W is now described. The outline of the procedure in the single-substrate type substrate processing apparatus according to the third embodiment is to perform etching processing with a chemical solution (dilute hydrofluoric acid) on the substrate W, thereafter perform rinse processing of washing out the chemical solution with deionized water and thereafter perform drying processing of the substrate W, similarly to the first embodiment. The processing up to the rinse processing is absolutely identical to that in the first embodiment, and hence redundant description is omitted.

After completion of the rinse processing, the substrate processing apparatus moves a processing solution nozzle 30 to a retreating position while the rotary motor 48 rotates the nozzle arm 43 to locate the gas nozzle 40 on the position immediately above the rotation center (axis J) of the substrate W.

After locating the gas nozzle 40 immediately above the rotation center of the substrate W, the substrate processing apparatus starts discharging the nitrogen gas from the gas nozzle 40 while starting rotating the gas nozzle 40 along the aforementioned locus directed from immediately above the rotation center of the substrate W toward the edge. At this time, the substrate processing apparatus rotates the spin base 10 and the substrate W held by the same.

The substrate processing apparatus sprays the nitrogen gas from the gas nozzle 40 to the rotation center of the substrate W while rotating the substrate W, thereby expelling moisture from the rotation center toward the edge. The substrate processing apparatus moves the gas nozzle 40 discharging the nitrogen gas from the position immediately above the rotation center of the substrate W toward the edge thereby increasing the expelled area of the substrate W. Such an expelled area is substantially circularly shaped as viewed from above due to the continuous rotation of the substrate W. Also in the third embodiment, the gas nozzle 40 plays a role of gradually ejecting visible moisture remaining on the substrate W toward the edge and loosely expelling the same by discharging the nitrogen gas at this time, similarly to that in the first embodiment.

When the gas nozzle 40 reaches a portion immediately above the edge of the substrate W, the substrate processing apparatus temporarily stops discharging the nitrogen gas from the gas nozzle 40. At this time, the substrate processing apparatus has expelled visible moisture from the substrate W. Thereafter the rotary motor 48 immediately rotates the nozzle arm 43 to re-locate the gas nozzle 40 immediately above the rotation center of the substrate W. When locating the gas nozzle 40 immediately above the rotation center of the substrate W, the substrate processing apparatus immediately restarts discharging the nitrogen gas from the gas nozzle 40 while secondly starting rotating the gas nozzle 40 along the aforementioned locus directed from the portion immediately above the rotation center of the substrate W toward the edge. At this time, the substrate processing apparatus continuously rotates the spin base 10 and the substrate W held by the same.

The substrate processing apparatus sprays the nitrogen gas from the gas nozzle 40 to the upper surface of the substrate W, i.e., the area already expelled by first nitrogen spraying from the gas nozzle 40. Thus, the substrate processing apparatus can also completely remove a trace of moisture remaining on a fine pattern or the like similarly to the first embodiment.

Thus, first nitrogen gas discharging and second nitrogen gas discharging from the gas nozzle 40 have different roles in the third embodiment, such that the first nitrogen gas discharging is performed for loosely expelling visible moisture and the second nitrogen gas discharging aims at completely removing a trace of moisture remaining on the fine pattern or the like. Therefore, the flow rate of the nitrogen gas secondly sprayed from the gas nozzle 40 to the substrate W is larger than that of the nitrogen gas firstly sprayed from the gas nozzle 40 to the substrate W.

When the gas nozzle 40 reaches the portion immediately above the edge of the substrate W, the substrate processing apparatus stops discharging the nitrogen gas from the gas nozzle 40. At this time, the substrate processing apparatus also completely removes moisture remaining in a trace from the overall upper surface of the substrate W.

Thereafter the substrate processing apparatus further increases the rotational frequency for the substrate W for performing finish drying. The subsequent procedure is identical to that of the first embodiment.

Effects similar to those of the first embodiment can be attained also in the aforementioned manner, while the structure of the substrate processing apparatus can be simplified due to the drying processing performed by the single gas nozzle 40. In consideration of reduction of the time interval between the first nitrogen gas spraying and the second spraying, however, it is preferable to provide two gas nozzles similarly to each of the aforementioned first and second embodiments.

<4. Modifications>

While the embodiments of the present invention have been described, the present invention is not restricted to the aforementioned examples. For example, while each of the substrate processing apparatuses according to the aforementioned embodiments employs nitrogen gas as the inert gas, the inert gas is not restricted to the nitrogen gas but another inert gas (e.g., helium) may alternatively be employed. Further, the gas nozzle(s) may discharge gas such as air in place of the inert gas. However, it is preferable to use the inert gas poor in reactivity, in order to attain an excellent drying result. Further, it is necessary to use sufficiently normalized clean air when spraying air to a semiconductor substrate formed with a fine pattern or the like.

The respective ones of the first and second gas nozzles 41 and 42 are not restricted to the mode of fixation to the nozzle arm 43 while directing the discharge ports 41a and 42a vertically downward, but the same may alternatively be fixed to the nozzle arm 43 in inclined postures.

While the substrate processing apparatus according to each of the aforementioned embodiments performs all of chemical solution processing, deionized water rinse processing and drying processing, it is also possible to transfer a substrate W subjected to chemical solution processing and deionized water rinse processing in another apparatus to the substrate processing apparatus according to each of the aforementioned embodiments for thereafter performing additional deionized rinse processing and drying processing.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus for spraying gas onto a substrate completely cleaned with deionized water for drying said substrate, comprising:
   a rotation element rotating said substrate substantially in a horizontal plane;
   a first gas discharge element for spraying an inert gas in substantially a single gas phase onto the surface of said substrate which is wet with said deionized water;
   a second gas discharge element for further spraying said inert gas in substantially a single gas phase onto the same region as the region previously sprayed with said gas by said first gas discharge element, said first gas discharge element and said second gas discharge element being arranged in such positions that respective flows of said inert gas from said first gas discharge element and said second gas discharge element do not interfere with each other;
   a moving control element for moving said first gas discharge element and said second gas discharge element so that arrival points of said inert gas discharged from the respective ones of said first gas discharge element and said second gas discharge element draw loci directed from a rotation center of said substrate rotated by said rotation element toward an edge; and
   a discharge control element for controlling discharge of said inert gas from said first gas discharge element and said second gas discharge element so that said second gas discharge element starts discharge of said inert gas while said first gas discharge element which has already started discharge of said inert gas is moved from said rotation center toward said edge, said discharge control element further controlling discharge of said inert gas from said first gas discharge element and said second gas discharge element so that a flow rate of said inert gas sprayed from said second gas discharge element onto said substrate is higher than a flow rate of said inert gas sprayed from said first gas discharge element.

2. A substrate processing apparatus spraying gas to a substrate completely cleaned with deionized water for drying said substrate, comprising:
   a rotation element rotating said substrate substantially in a horizontal plane;
   a first nozzle spraying an inert gas in substantially a single gas phase to the surface of said substrate wet with said deionized water;
   a second nozzle spraying said inert gas in substantially a single gas phase to the surface of said substrate;
   a nozzle arm fixedly provided with said first nozzle and said second nozzle, said first nozzle and said second nozzle being spaced apart from each other so that respective flows of said inert gas from said first nozzle and said second nozzle do not interfere with each other;
   a moving element moving said nozzle arm in a plane substantially parallel to said substrate;
   a moving control element controlling said moving element to move said nozzle arm so that arrival points of said inert gas discharged from the respective ones of said first nozzle and said second nozzle draw loci directed from a rotation center of said substrate rotated by said rotation element toward an edge, thereby spraying said inert gas from said second nozzle to the same region on said substrate once having been sprayed with said inert gas by first said nozzle; and
   a discharge control element for controlling discharge of said inert gas from said first nozzle and said second nozzle so that a flow rate of said inert gas sprayed from said second nozzle onto said substrate is higher than a flow rate of said inert gas sprayed from said first nozzle.

* * * * *